United States Patent
Jenq

(10) Patent No.: US 6,303,521 B1
(45) Date of Patent: Oct. 16, 2001

(54) METHOD FOR FORMING OXIDE LAYERS WITH DIFFERENT THICKNESSES

(75) Inventor: Jason Jyh-Shyang Jenq, Ping-Tong (TW)

(73) Assignee: United Microelectrics Corp., Hsin-Chu (TW)

( * ) Notice: Subject to any disclaimer, the term of this patent is extended or adjusted under 35 U.S.C. 154(b) by 0 days.

(21) Appl. No.: 09/690,522

(22) Filed: Oct. 17, 2000

(51) Int. Cl.[7] .................................................. H01L 21/469
(52) U.S. Cl. .............................................. 438/770; 438/981
(58) Field of Search ..................................... 438/264, 981, 438/770

(56) References Cited

U.S. PATENT DOCUMENTS

| | | | |
|---|---|---|---|
| 5,672,521 | * | 9/1997 | Barsan et al. . |
| 5,904,575 | * | 5/1999 | Ishida et al. ........................ 438/770 |
| 5,926,729 | * | 7/1999 | Tsai et al. ........................... 438/591 |
| 6,110,842 | * | 8/2000 | Okuno et al. ...................... 438/776 |

* cited by examiner

Primary Examiner—Richard Booth

(57) ABSTRACT

In the present invention, a method of forming multitude of growth rates of oxide layer on the surface of a substrate is provided. The method comprises providing a first oxide layer on the substrate. A photoresist layer is formed on the first oxide layer. The photoresist layer exposes a portion of the first oxide layer. The exposed portion of the first oxide layer is subjected to plasma fluoridation. Then the photoresist layer is removed. Again, the first oxide layer is removed and a second oxide layer is formed on the substrate.

11 Claims, 2 Drawing Sheets

METHOD FOR FORMING OXIDE LAYERS WITH DIFFERENT THICKNESSES

BACKGROUND OF THE INVENTION

1. Field of the Invention

The invention relates to a method for forming an oxide layer having multiple thicknesses, and more particularly to a method for forming gate oxides in which their thickness variations are slight.

2. Description of the Prior Art

High density and performance associated with ultra large scale integration require semiconductor devices with design features of 0.25 microns and under, e.g. 0.18 microns. The reduction of design features to 0.25 microns and below challenges the limitations of conventional semiconductor technology for forming gate oxides.

The reliability of circuit components is also affected by the thickness of the gate oxide. For example, if an excessive potential is applied to the gate electrode, the gate dielectric breaks down and causes a short circuit to occur between the gate electrode and the source of the transistor. The potential at which the gate dielectric breakdown occurs is termed the "breakdown voltage" and is related to the thickness of the gate oxide. Since the gate oxide must be thick enough to prevent gate dielectric breakdown, a thicker gate oxide is necessary to support a higher breakdown voltage under a higher operating voltage.

Certain semiconductor devices have circuit components operating at different voltages. For example, speed-critical components of a microprocessor are typically operated at a lower voltage, but less speed-critical components of the microprocessor are operated at a higher voltage. As another example, a device in combination of high-speed (HS0, low-power (LP) and input/output (I/O) CMOS is typically operated at a voltage about 1.2 V, 1.2 V and 2.5 V, individually. It is desirable to use different gate oxides for the different transistors. HS-CMOS can use a gate oxide region of about 16 to 33 angstroms, preferably 19 angstroms, LP-CMOS uses about 16 to 33 angstroms, preferably 25 angstroms and I/O-CMOS uses one about 33 to 80 angstroms, preferably 50 angstroms.

However, it is different to control well those gate oxides having different thicknesses with slight variation. If thickness of gate oxide cannot be precisely controlled, the reliability of those transistors is susceptible to poor performance.

SUMMARY OF THE INVENTION

It is an object of the present invention to provide a method of forming gate oxide layer having at least three thicknesses. The gate oxide layer is well controlled by plasma fluoridation.

It is another object of the present invention to provide a method for in-situ forming multiple gate oxides for high-speed, low-power and input/output transistors, respectively.

It is another object of the present invention to provide a method for in-situ formation of multiple gate oxides for high-speed, low-power and input/output transistors, respectively.

In the present invention, a method of forming multitude of growth rates of oxide layer on the surface of a substrate is provided. The method comprises providing a first oxide layer on the substrate. A photoresist layer is formed on the first oxide layer. The photoresist layer exposes a portion of the first oxide layer. The exposed portion of the first oxide layer is subjected to plasma fluoridation. Then the photoresist layer is removed. Again, the first oxide layer is removed and a second oxide layer is formed on the substrate.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered and that species and types of substrate and dopant as well as other materials substitutions can be freely made without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

In the present invention, a method of forming an oxide layer having at least three different thicknesses comprises providing a semiconductor structure having a first oxide layer thereon. A first photoresist layer is formed on the first oxide layer, which is exposed a portion of the first oxide layer. The exposed a first portion of the first oxide layer is subjected to a plasma fluoridation, then the first photoresist layer is removed. A second photoresist layer is formed on the first oxide layer, which is exposed a second portion of the first oxide layer. Then the second portion of the first oxide layer is removed. Next, the second photoresist layer is removed, and a second oxide layer is formed on the semiconductor structure and the first oxide layer.

FIGS. 1A–1D illustrate a process of forming multiple oxide thicknesses on a substrate 20. Shown in FIG. 1A, an oxide layer 21 is grown onto the surface of the substrate 20, and multitude of isolation devices 30 are formed in the substrate 20. The oxide layer 21 may be referred to as a sacrificial layer. In one embodiment, the oxide layer 21 has a thickness of approximately 20 angstroms. The isolation devices 30, such as shallow trench isolation structures, are formed by any conventional method, such as anisotropy etching.

Figure 1A:
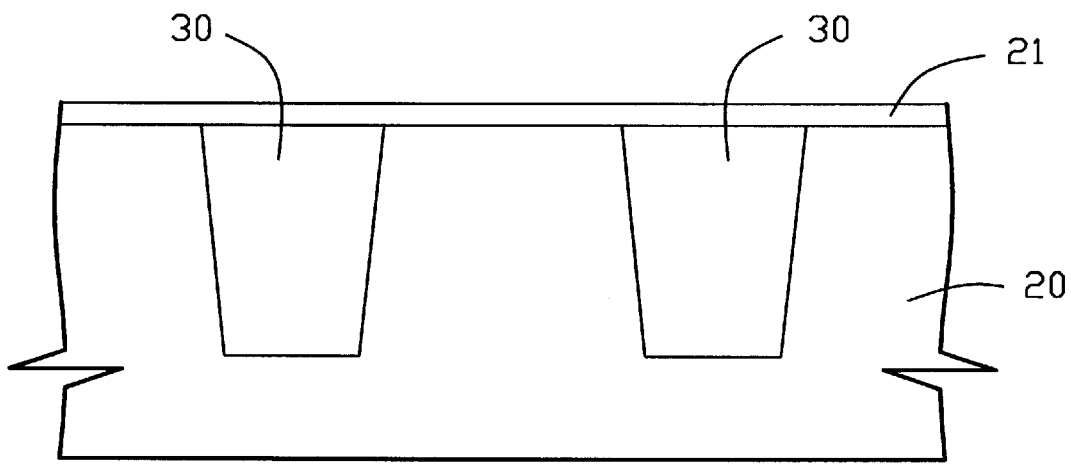
FIGS. 1A–1D are cross-sectional drawings illustrating a method for in-situ formation of gate oxides having at least three different thickness in accordance with the present invention.
Figure 1B:
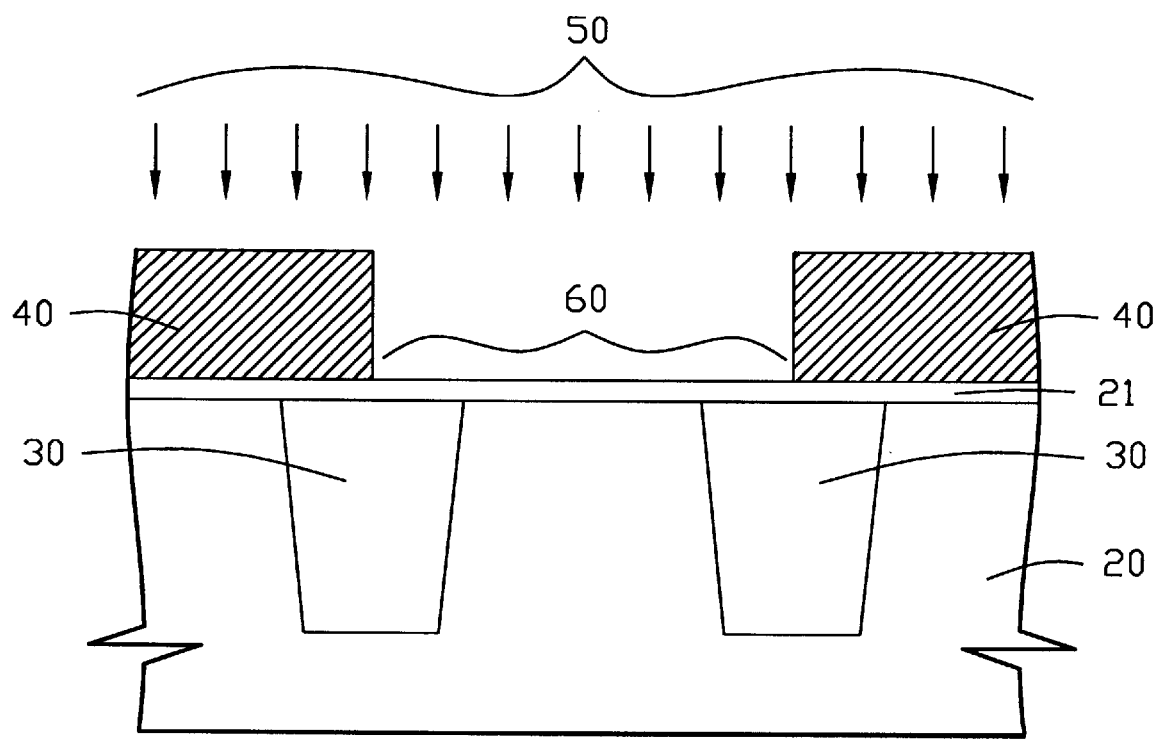
Figure 1C:
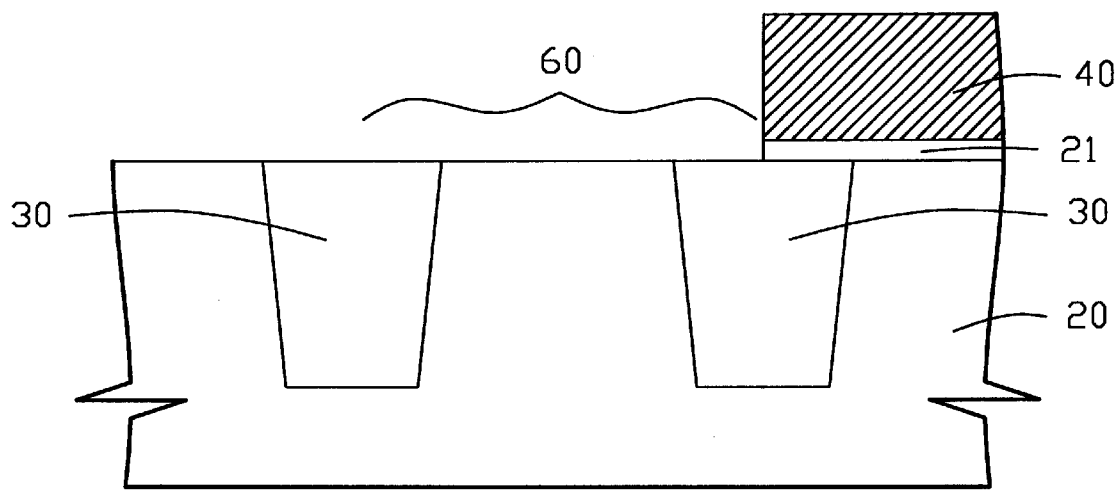

As a key step of the present invention depicted in FIG. 1B, a patterned photoresist layer 40 is then formed onto the surface of the oxide layer 21. A patterned photoresist layer 40 provides an opening region 60 that allows a plasma fluoridation 50 into the substrate 20 through the oxide layer 21. The opening region 60 is where the thicker gate oxide is desired. For example, the opening region 60 may be a location where a low-power CMOS transistor desired. The plasma fluoridation 50 is performed to form silicon fluoride (not shown) in the substrate 20 of the opening region 60. The source for the plasma may be a fluorine containing gas or its mixture with any other inert gas (Ar, etc.) or oxidizing gas (nitrous oxide, etc.). In one embodiment, the fluorine flow is between 10–50 sccm, and the nitrous oxide flow is also between 10–50 sccm. The plasma fluoridation causes fluorine to be incorporated into the substrate 20 of the opening region 60. This causes silicon fluoride formed on the substrate of the opening region 60. The silicon fluoride can enhance the oxidation growth of the substrate during oxidation because oxygen can easily replace fluorine of silicon fluoride that offers a reaction instead of breakage of silicon bonds. This effectively enhances the growth of gate oxide in the range of 20–30% at this location (opening region 60).

After the plasma fluoridation 50, the patterned photoresist layer 40 is removed. Then another patterned photoresist layer 41 covers a region 61 of the oxide layer 21 and the exposed portions of the oxide layer 21 are removed, shown as FIG. 1C. The region 61 is where the thickest gate oxide is desired. For example, the region 61 may be a location where an input/output CMOS transistor is desired. In the embodiment, fluorine can penetrate through the first oxide layer 21 and can contact the substrate 20 to form silicon fluoride on the surface substrate 20 by reacting with the substrate 20. The silicon fluoride can speed up oxidation growth of the substrate because oxygen can easily replace fluoride instead of conventional breakage of silicon bonds during the oxidation process. Nitrous oxide can react with the substrate 20 so as to slow down the oxidation growth of the substrate 20. Compared to conventional oxidation growth on the surface of the substrate, fluorine can raise the growth about 20% to 30%. By adjusting the flow rate of fluorine and nitrous oxide, the oxidation growth of the substrate 20 may be controlled. In particular, the flow rates of fluorine and nitrous oxide are individually about 10 to 50 sccm. In the embodiment, for meeting the requirement of low power CMOS, fluorine in the plasma 50 is enough to speed up the oxidation growth of the first bare region 60. However, the surface property of the substrate can be changeable in ways not only limited by the plasma 50.

Figure 1D:
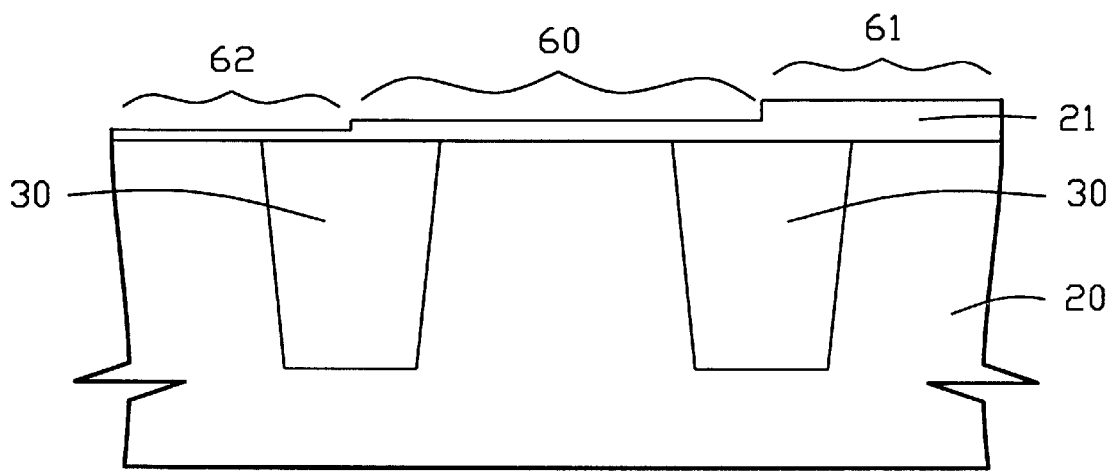

Thereafter, the patterned photoresist layer 41 is removed. Then the wafer is placed into furnace at a temperature about 1000° for post annealing step. There are different gate oxide thicknesses grown on the whole surface of the substrate 20. As shown in FIG. 1D, a region 62 has the thinnest oxide thickness of approximately 19 angstroms for the post annealing step. The region 62 may be a location where a high-speed CMOS transistor is desired. The opening region 60 has the thicker oxide thickness of approximately 25 angstroms due to the enhancing effect of silicon fluoride therein. The region 61 has the thickest oxide thickness of approximately 50 angstroms due to the addition of oxide for the post annealing step. In the embodiment, the plasma fluoridation offers well controllability on the oxide thicknesses, especially when the thickness variation is very slight, for example, within 10 angstroms. The resulted oxide layer can offer various CMOS transistors integrated on a chip.

What is claimed is:

1. A method of forming a plurality of growth rates of oxide layer on the surface of a substrate, said method comprising:

providing a first oxide layer on said substrate;

forming a photoresist layer on said first oxide layer, said photoresist layer exposing a portion of said first oxide layer;

subjecting said exposed portion of said first oxide layer to a plasma fluoridation;

removing said photoresist layer;

removing said first oxide layer; and forming a second oxide layer on said substrate.

2. The method according to claim 1, wherein said plasma fluoridation comprises a fluorine flow in the range of 10 sccm to 50 sccm.

3. A method of forming an oxide layer having at least three different thicknesses, said method comprising:

providing a semiconductor structure having a first oxide layer thereon;

forming a first photoresist layer on said first oxide layer, said first photoresist layer exposing a first portion of said first oxide layer;

subjecting exposed said first portion of said first oxide layer to a plasma fluoridation;

removing said first photoresist layer;

forming a second photoresist layer on said first oxide layer, said second photoresist layer exposing a second portion of said first oxide layer, said second portion comprising said first portion;

removing said second portion of said first oxide layer;

removing said second photoresist layer; and forming a second oxide layer on said semiconductor structure and said first oxide layer.

4. The method according to claim 3, wherein said plasma fluoridation comprises a fluorine or mixture thereof with an inert gas or an nitrous oxide gas.

5. A method of forming triple gate oxides of complementary metal-oxide-semiconductor devices on a substrate, said method comprising:

providing a first oxide layer on said substrate;

forming a first photoresist layer on said first oxide layer, said first photoresist layer exposing a first portion of said first oxide layer;

subjecting said exposed said first portion to a plasma comprising argon and fluorine gases;

removing said first photoresist layer;

forming a second photoresist layer on said first oxide layer, said second photoresist layer exposing a second portion of said first oxide layer;

removing said second portion of said first oxide layer;

removing said second photoresist layer;

forming a second oxide layer on said substrate and said first oxide layer; and forming a plurality of gate structures on said substrate.

6. The method according to claim 5, wherein said plasma further comprises an nitrous oxide gas.

7. The method according to claim 5, wherein forming said gate structures comprise:

forming a dielectric layer on said second oxide layer;

forming a third photoresist layer on said dielectric layer;

etching said dielectric layer, said second oxide layer, and said first oxide layer to form said gate structures; and removing said third photoresist layer.

8. The method according to claim 5, wherein said complementary metal-oxide-semiconductor devices comprise a high-speed complementary metal-oxide-semiconductor, a low-power complementary metal-oxide-semiconductor and an input/output complementary metal-oxide-semiconductor.

9. The method according to claim 8, wherein said input/output complementary metal-oxide-semiconductor has a gate oxide layer said first oxide layer and said second oxide layer.

10. The method according to claim 8, wherein said gate structure is used in said low-power complementary metal-oxide-semiconductor.

11. The method according to claim 8, wherein said gate structure is used in said high-speed complementary metal-oxide-semiconductor.

* * * * *